(12) United States Patent
Minot

(10) Patent No.: US 8,311,782 B2
(45) Date of Patent: Nov. 13, 2012

(54) METHOD OF ROUTING THE PHYSICAL LINKS OF AN AVIONICS PLATFORM

(75) Inventor: Frédéric Minot, Venerque (FR)

(73) Assignee: Airbus Operations SAS, Toulouse (FR)

( * ) Notice: Subject to any disclaimer, the term of this patent is extended or adjusted under 35 U.S.C. 154(b) by 208 days.

(21) Appl. No.: 12/837,802

(22) Filed: Jul. 16, 2010

(65) Prior Publication Data

US 2011/0015900 A1  Jan. 20, 2011

(30) Foreign Application Priority Data

Jul. 17, 2009  (FR) ...................................... 09 54988

(51) Int. Cl.
*G06F 17/10* (2006.01)
(52) U.S. Cl. ..................................... 703/2; 703/1; 703/8
(58) Field of Classification Search .................. 703/1, 2, 703/6–8
See application file for complete search history.

(56) References Cited

U.S. PATENT DOCUMENTS

| | | | | |
|---|---|---|---|---|
| 6,535,397 | B2 * | 3/2003 | Clark et al. ................... | 361/788 |
| 2002/0180554 | A1 * | 12/2002 | Clark et al. ...................... | 333/33 |
| 2003/0056494 | A1 * | 3/2003 | Coleman ......................... | 60/239 |
| 2007/0243505 | A1 * | 10/2007 | Rath et al. ....................... | 434/29 |
| 2010/0140415 | A1 * | 6/2010 | Goossen ..................... | 244/23 A |

FOREIGN PATENT DOCUMENTS

| | | |
|---|---|---|
| WO | WO 02/23688 A2 | 3/2002 |
| WO | WO 02/23688 A3 | 3/2002 |

OTHER PUBLICATIONS

U.S. Appl. No. 12/781,276, filed May 17, 2010, Minot.
U.S. Appl. No. 12/781,273, filed May 17, 2010, Minot.
European Search Report issued Aug. 6, 2010 in EP 10 16 9331.
Richard L. Alena, et al., "Communications for Integrated Modular Avionics", Aerospace Conference, 2007 IEEE, IEEE, Piscataway, NJ, USA, XP031214239, ISBN: 978-1-4244-0524-4, Mar. 3, 2007, pp. 1-18.

* cited by examiner

*Primary Examiner* — Russell Frejd
(74) *Attorney, Agent, or Firm* — Oblon, Spivak, McClelland, Maier & Neustadt, L.L.P.

(57) ABSTRACT

A method of routing the physical links of a avionics platform inside an aircraft. A physical link connects a plurality (N) of equipment units and is composed of one or more branches, where each branch of the link connects a sender equipment unit to a receiver equipment unit. The method makes it possible to minimize the total cabling length of the platform and, where applicable, to choose among various positions of the equipment units inside the aircraft and/or various routing graphs.

12 Claims, 11 Drawing Sheets

METHOD OF ROUTING THE PHYSICAL LINKS OF AN AVIONICS PLATFORM

TECHNICAL FIELD

The present invention generally concerns the area of avionics platforms and more specifically those made with an integrated modular architecture, known as IMA (Integrated Modular Avionics).

PRIOR STATE OF THE ART

An avionics platform, i.e., all the on-board computation and communications equipment used to carry out the functions of an aircraft, traditionally makes use of dedicated communication buses and computers. In such a platform, each function of the aircraft, hereinafter referred to as an avionic function, is implemented by means of computers having an architecture and inputs-outputs specific to the performance of the function. This implies making, certifying and maintaining a great number of components or LRUs (Line Replaceable Units) whenever a new type of equipment unit needs to be designed.

To alleviate this source of complexity and costs, new-generation avionics platforms use, whenever possible, an integrated modular architecture (IMA). In such architecture, the avionic functions are implemented in shared resources, in practice in the form of software modules hosted by generic computers, and using non-dedicated means of communication. Such a platform offers numerous advantages in terms of reducing the quantity of computers, the number of different types of computers, the number of cables, etc., which ultimately results in a more favorable mass balance and significant gains in terms of maintenance and inventory management.

Nevertheless, whereas traditional avionics platforms were produced in an empirical manner, using rules based on experience and frequently moving back and forth between the design phase and the validation phase, the new-generation platforms require an entirely different approach, both because of their complexity and the sharing of resources among avionic functions, inherent in the IMA architecture. For example, whereas the attendant hardware failures of functional equipment used to be avoided by using dedicated computing and communication resources, the IMA architecture is incapable of guaranteeing such robustness in AN intrinsic manner. It is therefore necessary to distribute the software modules judiciously in the generic computers and to make sure that the means of communication can handle exchanges among those modules.

Once the software modules have been distributed among the generic computers, it is necessary to interconnect said computers either by means of direct physical links or by means of one or more networks, so that the software modules may communicate according to a predetermined functional scheme. The networks themselves are composed of communication nodes such as switches, routers, gateways, interconnected by network links. The installation of the avionics platform requires routing a large number of physical links within the aircraft, where each physical link connects a sender equipment occurrence to one or more receiver equipment occurrences, where each such receiver equipment occurrence is connected to the sender equipment occurrence by a branch of said physical link, where each branch of the physical link is achieved by means of one or more cables connected end to end. Routing the physical links amounts to defining the cables that comprise said links and their routing in the structure of the aircraft. Routing a cable means choosing a three-dimensional path inside the aircraft, hereinafter referred to as a routing path.

Conventionally, each cable relating to a physical link is assigned a routing path according to the positions of the equipment units that it must interconnect, the characteristics of the signals that it must carry and the criteria of segregation. It is understandable, for example, that cables intended to carry data take different paths from the power supply cables and that certain cables carrying redundant information must be segregated for reasons of security. The traditional routing methods, however, are generally empirical and do not permit optimal minimization of the cable length.

The purpose of the present invention is to propose a method of physical link routing that will significantly reduce the cabling length in an IMA avionics platform and consequently lower the overall mass of the aircraft.

A second purpose of the present invention is to be able to evaluate the physical link routing in an avionics platform with a given architecture based on the criterion of cabling length.

A third purpose of the present invention is to make it possible to compare avionics platforms that pertain to the same aircraft but have different architectures, in terms of optimality of the physical link routing.

A subsidiary purpose of the present invention is to make it possible to evaluate, for a given routing of physical links, the impact on the aircraft's avionic functions of a loss of a cabling element or of an equipment occurrence.

DESCRIPTION OF THE INVENTION

The present invention is defined by a method of computerized routing of a physical link of an avionics platform inside an aircraft, where said physical link connects a plurality of physical equipment units and is composed of one or more branches, where each branch of said link connects a sender equipment unit to a receiver equipment unit of said plurality. According to this method:

the positions of the sender and receiver equipment units are projected onto at least one predetermined routing graph inside the aircraft and said graph is extended at the points defined by said positions and by their respective projections on the graph;

for each branch of said link, one determines the shortest path through the graph thus extended between the sender and receiver equipment units that it connects, where said path, called a routing path, is defined by an ordered list of segments between said equipment units;

one eliminates the redundant segments between the routing paths to obtain pruned paths;

one determines derivation points as the segment extremities common to at least three segments of said pruned paths;

one defines, based on each pruned path, a set of cables whose extremities are located either at an equipment unit point or at a derivation point, with said cables being routed along the routing path.

The cables may be advantageously defined by concatenating, for each pruned path, the segments comprising said path, with the operation of concatenation progressing in the direction of the branch and being interrupted whenever it reaches a derivation point or receiver equipment unit, with a cable being defined by the concatenated segments between two successive interruptions.

For each branch, the shortest path in the routing graph between the sender equipment unit and the receiver equipment unit may be preferably obtained by means of the Dijkstra algorithm.

The routing method advantageously uses:
- a first database, in which a representation of at least said routing graph is stored, where said routing graph is defined by its nodes and by the edges connecting said nodes;
- a second database, in which a representation of the physical links of the avionics platform is stored and, for each physical link, the various branches that comprise it.

Moreover, a representation of the cables connecting the equipment units may be stored in a third database, and the routing path associated with each cable may be stored in a fourth database.

If need be, routing method may also store a representation of said derivation points.

The first database may also contain a representation of the cut points, where a cut point is defined as the intersection of a routing path with the abutment of two consecutive sections forming the aircraft.

The routing may be advantageously performed for all the physical links of the avionics platform and the a total cabling length may be calculated as the sum of the lengths of the cables obtained for all the physical links, where the length of a cable is determined as the sum of the lengths of the segments that form it.

The routing may be repeated for various positions of the equipment units, and then one selects the set of positions of said equipment units that leads to the shortest total cabling length.

Similarly, the routing may be repeated for different routing graphs, and one then selects the routing graph that leads to the shortest total cabling length.

According to one variant, the routing is repeated for different positions of the equipment units and/or different routing graphs, and one selects the set of positions of said equipment units and/or the routing graph that leads to the lowest number of cut points.

Finally, in one particular embodiment, one simulates an accident of the aircraft and determines a first list of cables (CAB_L) impacted by said accident, from points of the routing graph that are themselves impacted, and/or a second list of equipment units (EQ_L) impacted by said accident. Then the following items are deduced:
- a first set (FO_L) of software modules hosted by said equipment units of the second list;
- a second set (FLO_L) of function links between software modules, where said function links are affected either because of a software module to which they are connected, belonging to the first set, or because of a cable of the first list supporting a topological link used by said function links.

BRIEF DESCRIPTION OF THE DRAWINGS

Other characteristics and advantages of the invention will appear when reading the preferred embodiments of the invention in reference to the appended figures, among which.

Figure 8:
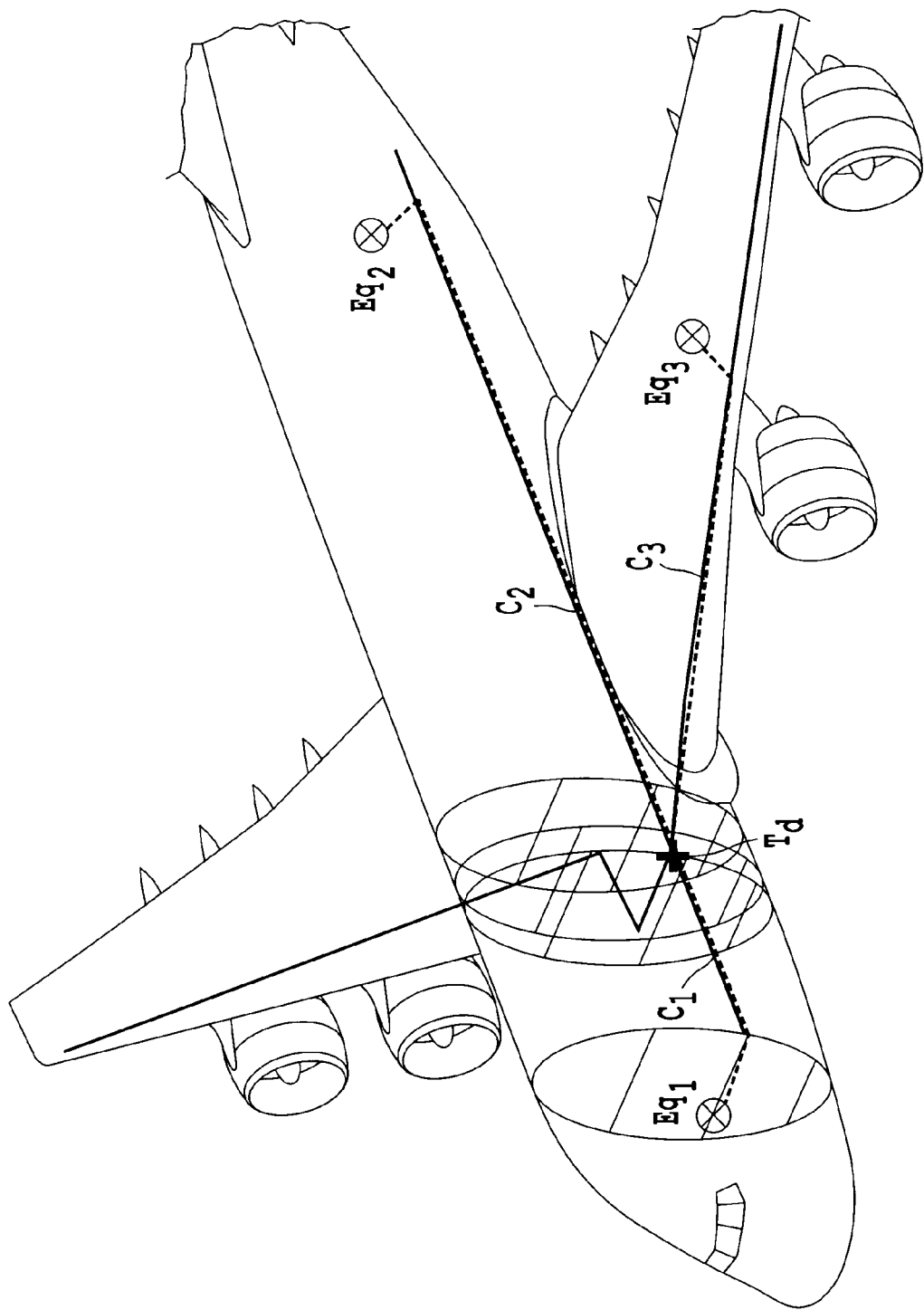
Figure 9A:
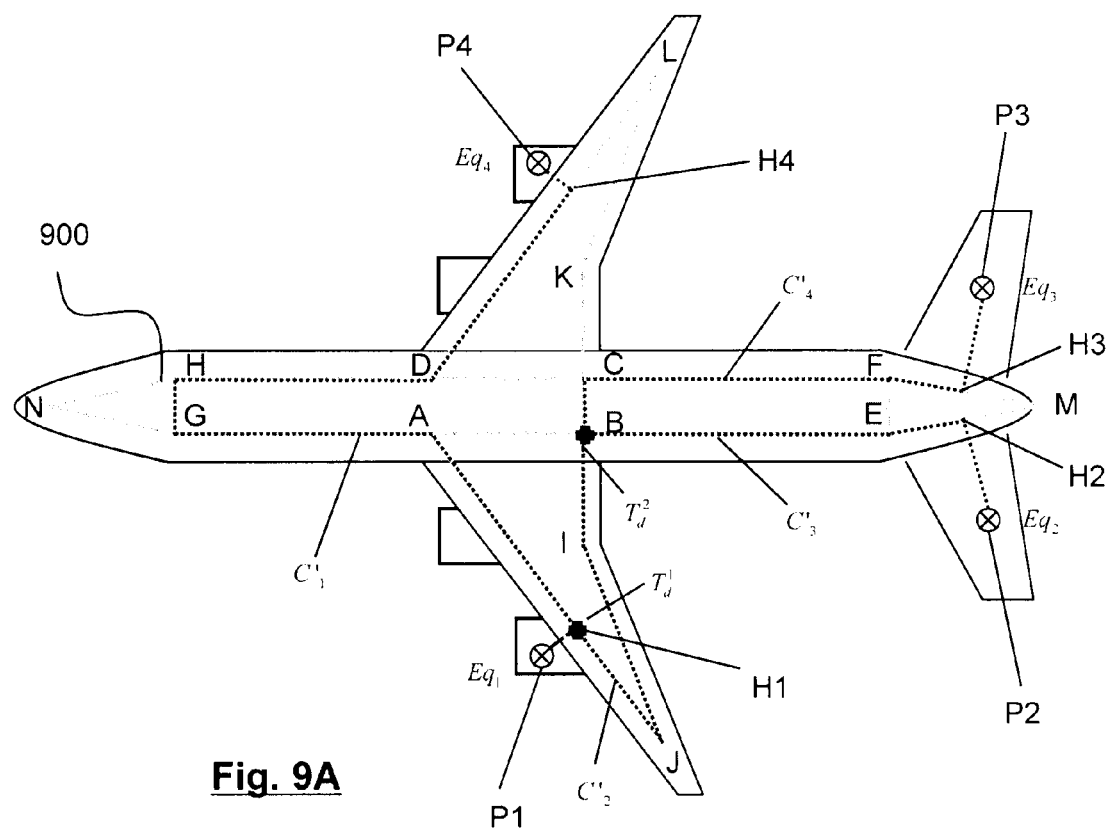
Figure 9B:
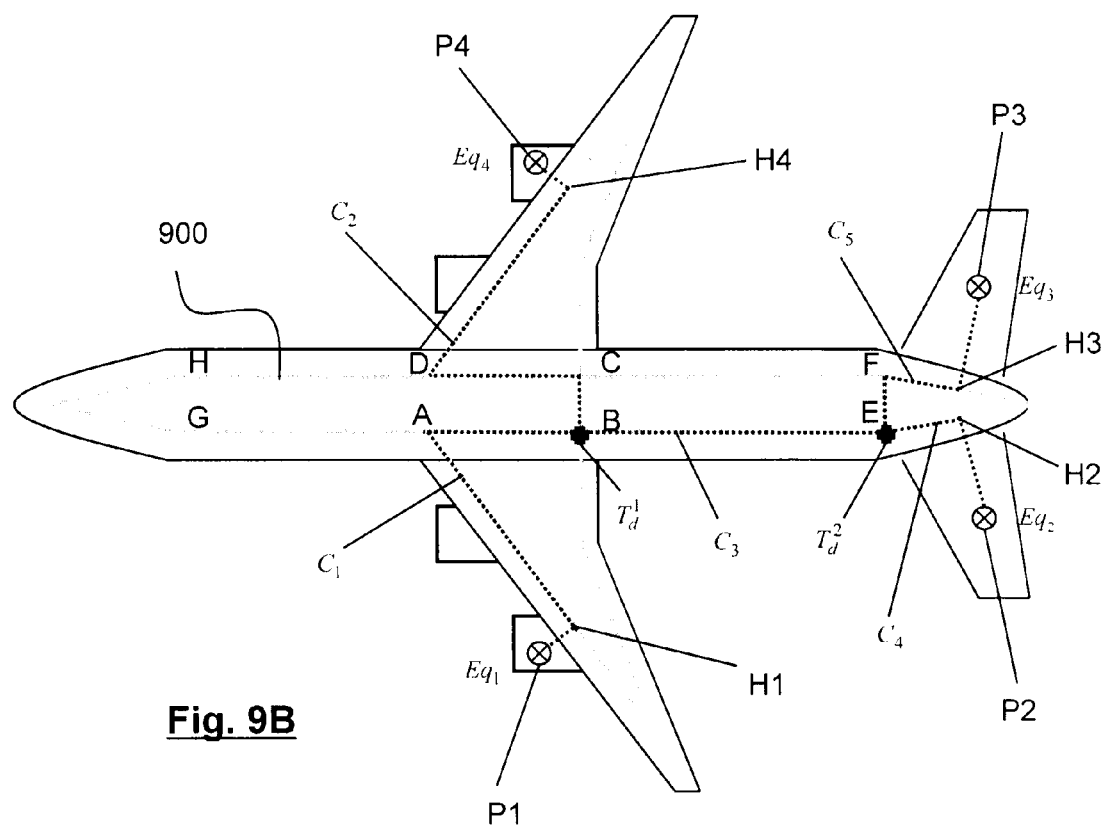
Figure 10:
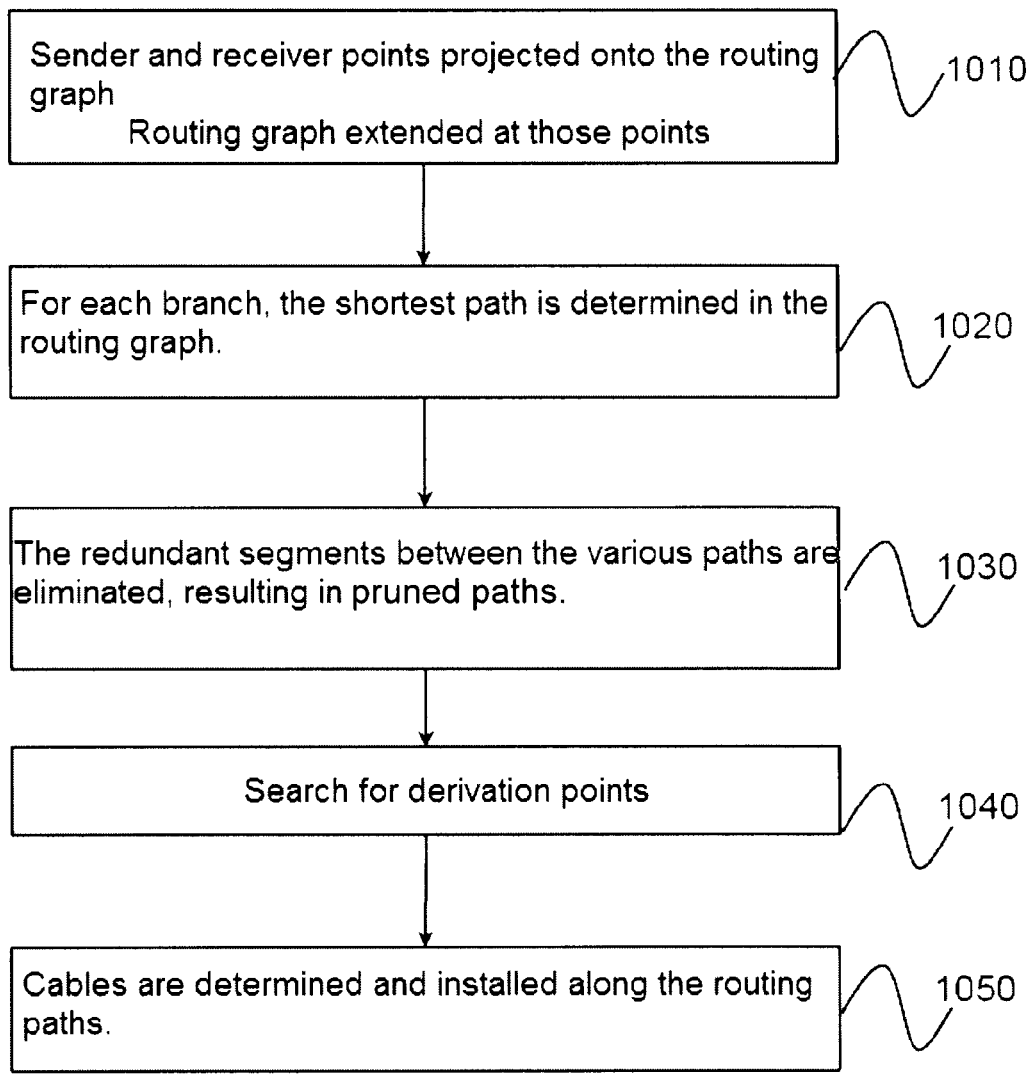

The FIG. 8 gives an example of cable paths in an aircraft;

FIGS. 9A and 9B illustrate different possible routings for a physical link of an avionics platform;

FIG. 10 is a flowchart of the routing method of a physical link according to one embodiment of the invention.

DETAILED DESCRIPTION OF PARTICULAR EMBODIMENTS

Before describing the routing method according to the invention, we shall now describe an avionics platform according to an integrated modular architecture. Said platform is designed to implement a set of predetermined avionic functions. By way of example, such avionic functions may be the roll control of the airplane, the calculation of fuel quantity, etc.

Each such avionic function is generally associated with a plurality of software modules that are designed to be hosted in onboard generic computers and each of which participates in the implementation of the function. For reasons of security, certain functions may be duplicated. The software modules of duplicated functions are not necessarily identical. For example, two such software modules may correspond to a command channel (COM) and a monitoring channel (MON) of a flight control system and use different algorithms to achieve the same function.

The software modules associated with the various avionic functions may exchange messages with one another via links, called "function link occurrences", as we shall see below. For example, a software module performing the later control function may transmit a warning message to a software module in charge of the display function.

All the avionic functions of an aircraft as well as the relationships among said functions may be advantageously represented using object modeling.

Figure 1:
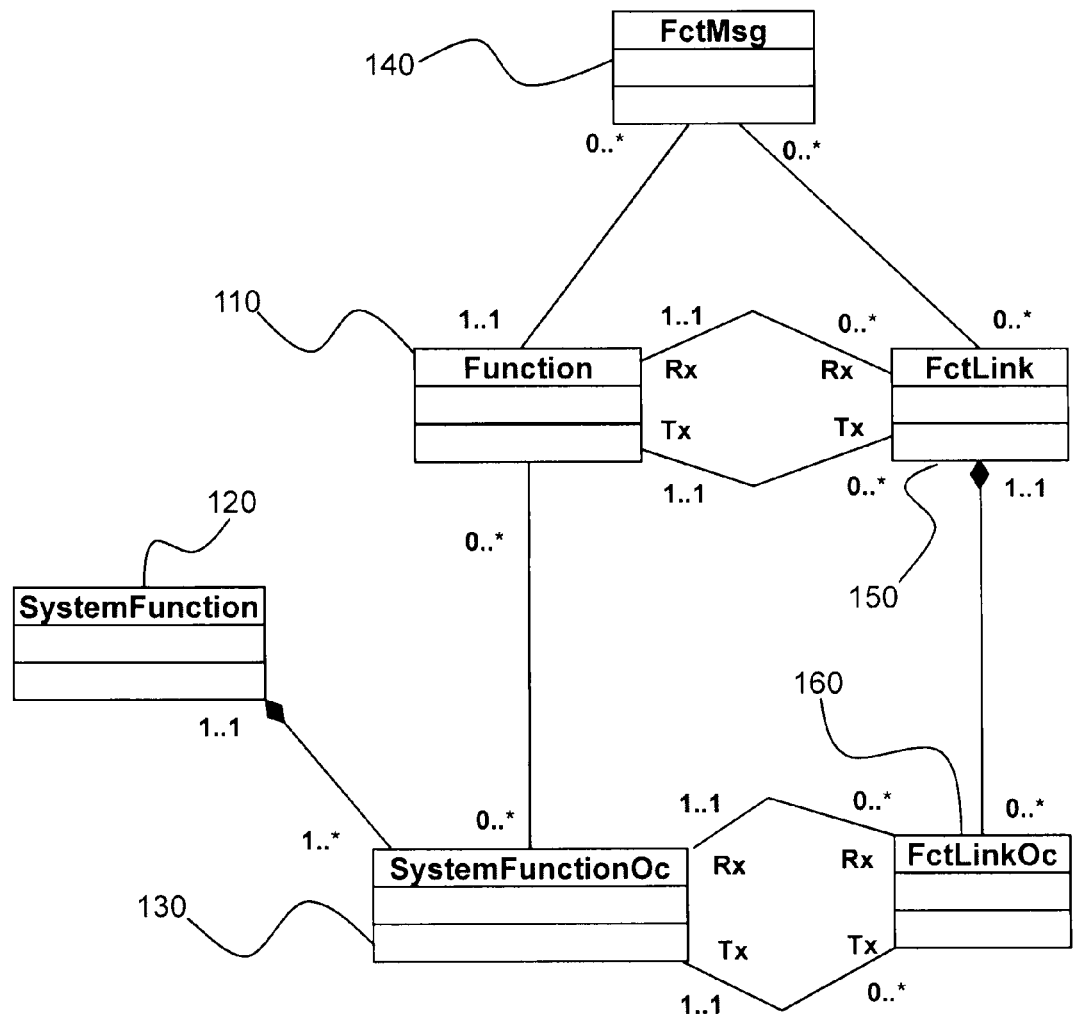
FIG. 1 gives an object-oriented schematic representation of the avionic functions of an aircraft.

FIG. 1 shows a UML (Unified Modeling Language) diagram modeling the data structure and the relations among avionic functions of an aircraft. A description of the UML language may be found, for example, in F. Barbier's work entitled "UML2 et MDE" published by Dunod.

The model represented includes the objects (or classes) called "Function", "SystemFunction", "SystemFunctionOc", "FctMsg", "FctLink" and "FctLinkOc". For reasons of simplification, the attributes and methods concerning the various objects have been omitted whenever not essential to a proper understanding of the invention.

The "Function" object, 110, corresponds to an avionic function. Said object is associated with any plurality of "SystemFunctionOc" objects, 130, made explicit below. A function may transmit any number of messages to another function by means of a symbolic link, called a function link. Thus, the "Function" object, 110, is associated with 0 to N "Fctmsg" objects, 140, describing the messages in question. Each function link, modeled by the "FctLink" object, 150, is associated with a transmitting avionic function and a receiving avionic function. Reciprocally, a function may be associated with any number of input links and output links. Moreover, a function link may have any number of messages pass through and, reciprocally, a message from an avionic function may be transmitted any number of function links.

Each function link, 150, is instantiable and composed of 0 to N function link occurrences, 160. The function link occurrences are designated by the object "FctLinkOc".

The "SystemFunction" object, designated by 120, is composed of at least one "SystemFunctionOc" occurrence, 130. The object 130 may be considered in practice as a software module designed to be hosted by a equipment unit, in which case object 120 represents a class of such software modules. The object 130 is associated with any number of input function link occurrences, as well as any number of output function links. Reciprocally, an function link occurrence is associated with a transmitting software module and a receiving software module.

The model represented in FIG. 1 gives a functional representation of an avionics platform. The avionics platform may also be illustrated by a hardware representation.

Figure 2:
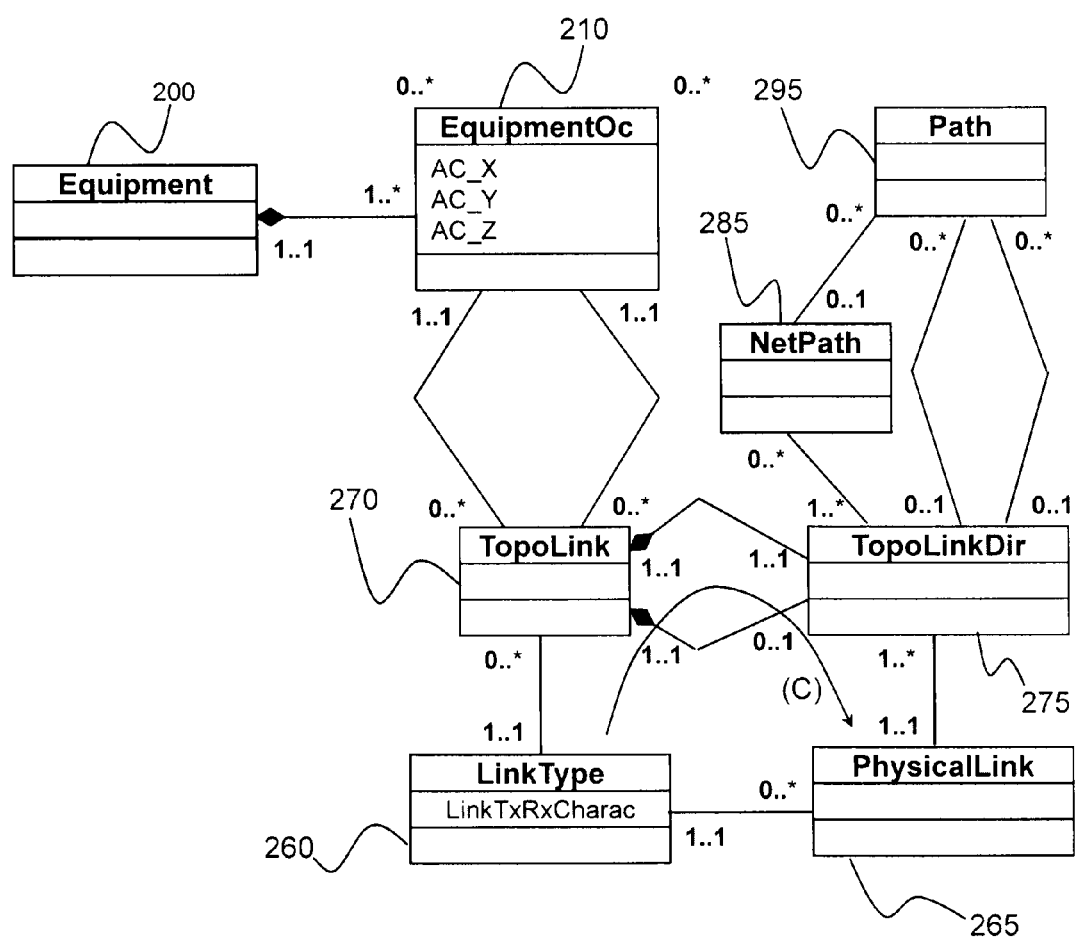
FIG. 2 gives an object-oriented schematic representation of an avionics platform.

FIG. 2 shows, in the form of an UML diagram, the data structure of such a representation.

Within the scope of the present invention, the hardware structure of an avionics platform is generally described using objects called "Equipment", "EquipmentOc", "TopoLink", "TopoLinkDir", "NetPath", "Path", "Physical Link" defined below.

The basic building block of said hardware structure is the "Equipment" object, 200, which itself is composed of one or more equipment occurrences, 210. In concrete terms, the "Equipment" object represents a class composed of hardware elements such as computers, sensors, actuators, switches, routers, gateways, etc. An equipment unit may more generally be considered a hardware element having computing and/or communication resources. Each equipment occurrence, 210, inherits the attributes of the "Equipment" object, particularly the hardware resources of said object, as we shall see below. Moreover, it is characterised by its own attributes, particularly its position in the aircraft, given here in Cartesian coordinates relative to given point of reference.

The "PhysicalLink" object, 265, represents the physical links, independently from the network to which they may belong. For example, a physical link may connect one equipment occurrence with one or more other equipment occurrences. Each physical link may be composed of one or more physical link branches, where a physical link branch connects one equipment occurrence with another single equipment occurrence.

The "TopoLink" or topological link object, 270, is abstract entity indicating the possibility of connecting two equipment occurrences by means of a physical link, in either a unidirectional or bidirectional manner. Using said object, a directional topological link or "TopoLinkDir", 275, is defined, where each topological link is composed either of one or of two directional topological links. The "TopoLinkDir" object may be considered equivalent to a physical link branch.

Then the path network object "NetPath", 285, is defined, as an ordered and connected list of directional topological links among communication network nodes. It is important to stress that the physical links underlying said directional topological links do not necessarily belong to the same network. A network path contains at least one topological link and, inversely, a directional topological link may be part of any number of network paths, or even of no network path if said link is isolated.

Finally, a more general object is defined, called a "Path" or topological path, 295, which may connect any two equipment occurrences of the avionics platform. Such a path is composed either of a directional topological link in either direction (in other words, the equipment occurrences are connected by a single physical link) or by a network path to which a directional topological link is joined at either or both extremities.

The model represented in FIG. 2 can be used to store the hardware representation of the avionics platform in a database, called the hardware database.

Figure 3A:
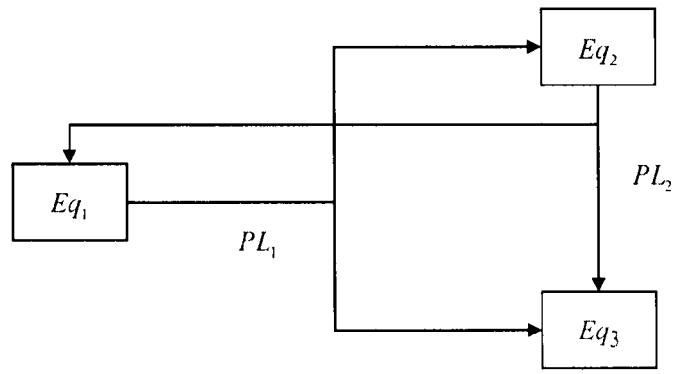
FIG. 3A through 3C show the relations between a topological link, physical link and branch of a physical link.
Figure 3B:
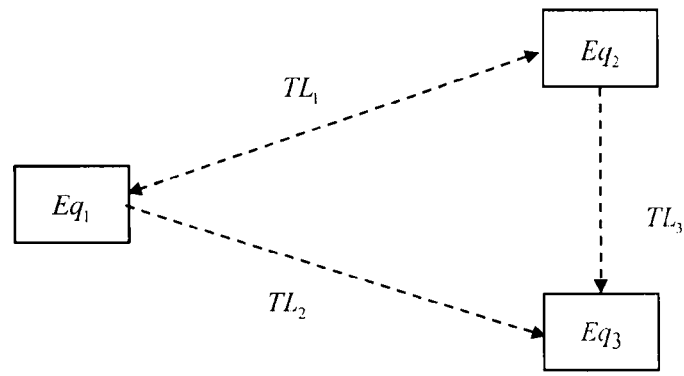
Figure 3C:
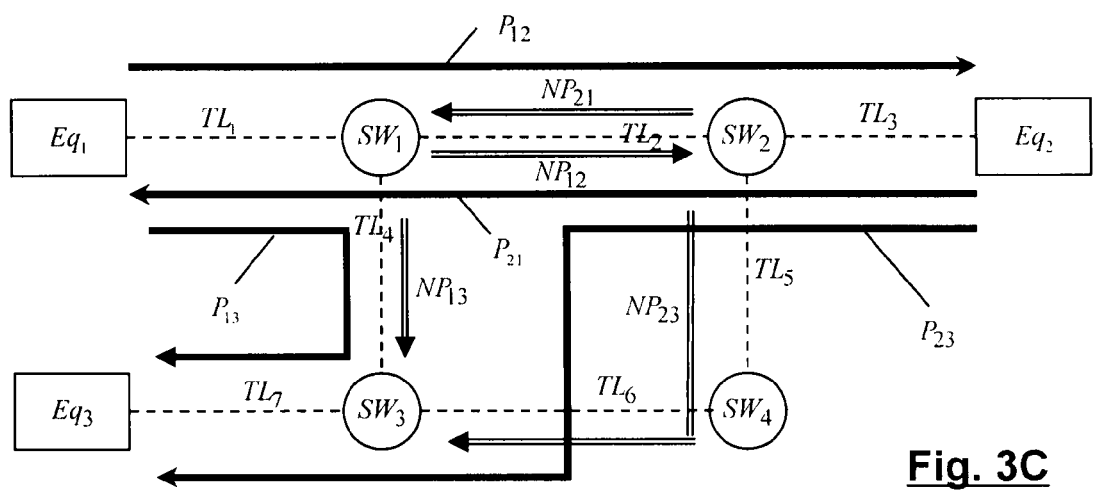

By way of illustration, FIGS. 3A to 3C give some examples of physical links, physical link branches, topological links, network paths and topological paths among various equipment units.

Those figures show three equipment units (more strictly speaking, according to object terminology, three equipment occurrences) $Eq_1, Eq_2, Eq_3$.

In FIG. 3A, the equipment unit $Eq_1$ is connected to the equipment units $Eq_2, Eq_3$ by means of a first physical link $PL_1$ of a multicast type ($1 \Rightarrow N$). Similarly, the equipment unit $Eq_2$ is connected to the equipment units $Eq_1, Eq_3$, by means of a second physical link $PL_2$ of the multicast type. The physical link $PL_1$ is composed of two branches of physical link $BPL_1^1$ and $BPL_1^2$, connecting $Eq_1$ respectively to $Eq_2$ and $Eq_3$. Similarly, the physical link $PL_2$ is composed of two branches of physical links $BPL_2^1$ and $BPL_2^2$, connecting $Eq_2$ respectively to $Eq_1$ and $Eq_3$.

FIG. 3B represents the topological links $TL_1$, $TL_2$, $TL_3$ associated with the physical links of FIG. 3A. More precisely, the topological link $TL_1$ between the equipment units $Eq_1$ and $Eq_2$ is associated with the physical links $PL_1$ and $PL_2$ between those two equipment units. The topological link $TL_1$ is in fact composed of a first directional topological link between $Eq_1$ and $Eq_2$ and a second directional topological link in the opposite direction. The topological links $TL_2$ and $TL_3$ are respectively associated with the physical links $PL_1$ and $PL_2$. They are each composed of a unidirectional topological link.

FIG. 3C represents three equipment units $Eq_1, Eq_2, Eq_3$ connected by means of an AFDX network containing four switches $SW_1, \ldots, SW_4$. $TL_1$ to $TL_7$ refer to the various bidirectional topological links (underlying physical links of the monocast type $1 \Leftrightarrow 1$), where each topological link $TL_1$ is composed of two directional topological links $TL_1^+$ and $TL_1^-$ (by convention, the positive direction is represented here as moving clockwise). The network paths $NP_{12}$ $NP_{21}$, $NP_{13}$, $NP_{23}$ have also been indicated, designated respectively by $NP_{12} = \{TL_2^+\}$; $NP_{21} = \{TL_2^-\}$; $NP_{13} = \{TL_4^+\}$; $NP_{23} = \{TL_5^+, TL_6^+\}$. The topological path $P_{12}$ that connects the equipment unit $Eq_1$ to the equipment unit $Eq_2$ is then composed of $P_{12} = \{TL_1^+, NP_{12}, TL_3^+\}$. Similarly, the topological path $P_{21}$ that connects the equipment unit $Eq_2$ to the equipment unit $Eq_1$ is composed of $P_{21} = \{TL_3^-, NP_{21}, TL_1^-\}$. The topological path $P_{13}$, connecting the equipment unit $Eq_1$ à $Eq_3$, and the topological path $P_{23}$ connecting the equipment unit $Eq_2$ to $Eq_3$ are respectively composed of $P_{13} = \{TL_1^+, NP_{13}, TL_7^+\}$ and $P_{23} = \{TL_3^-, NP_{23}, TL_7^+\}$.

Figure 4:
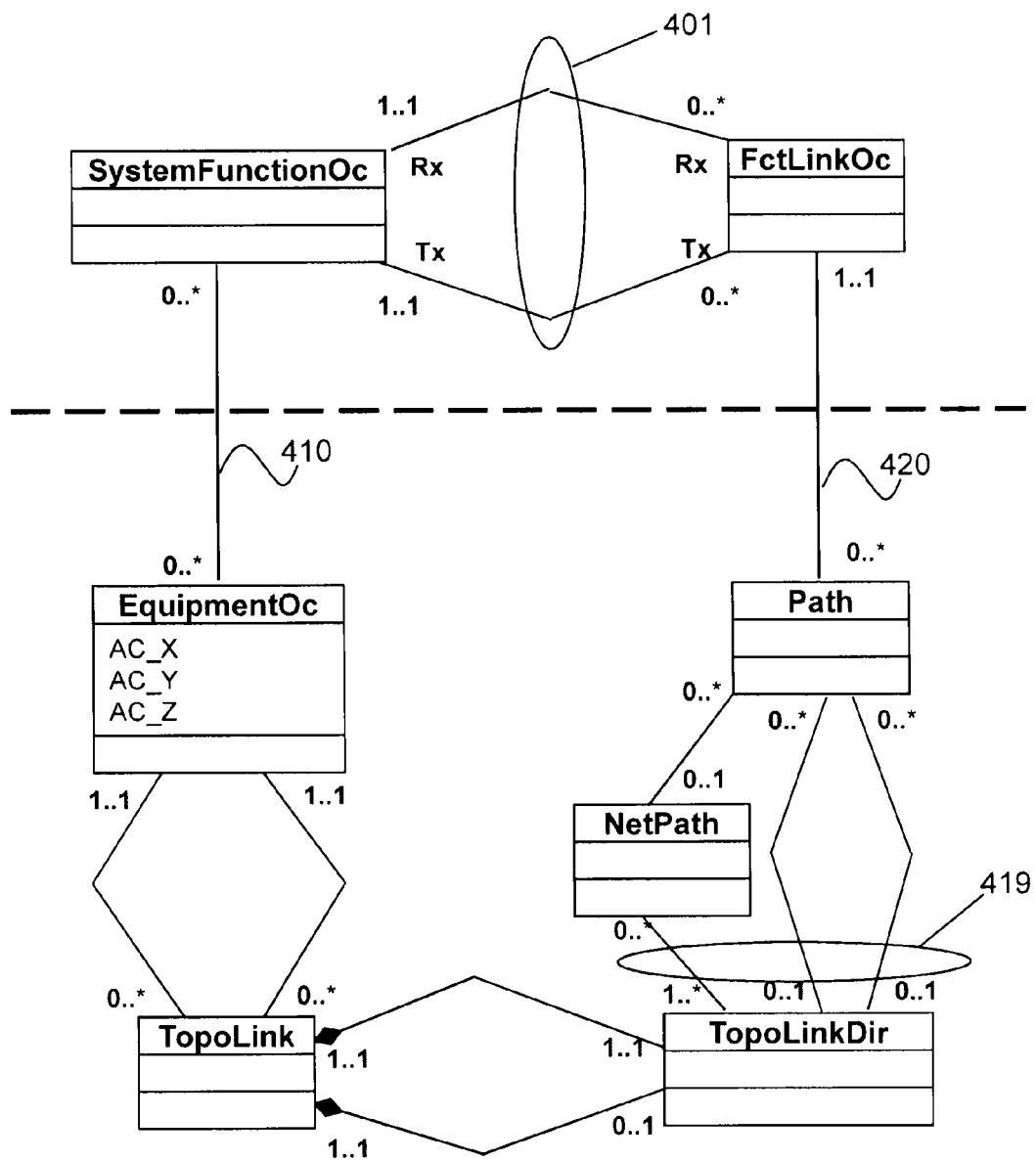
FIG. 4 represents schematically the implementation of the avionic functions on the avionics platform.

FIG. 4 represents schematically the implementation of the avionic functions on the avionics platform.

Said figure shows part of the platform's functional structure model and part of its hardware structure model, separated schematically by a dotted line. The implementation of the platform consists in linking, on the one hand, each "SystemFunctionOc" object, i.e., each software module of an avionic function to an equipment occurrence "EquipmentOc" intended to host said module and, on the other hand, each function link "FctLinkOc" to one or more paths intended to carry the functional messages among the software modules related to the avionic functions.

The hardware implementation of the avionic functions in the platform is shown in the diagram by the linking relationships 410 and 420.

Figure 5:
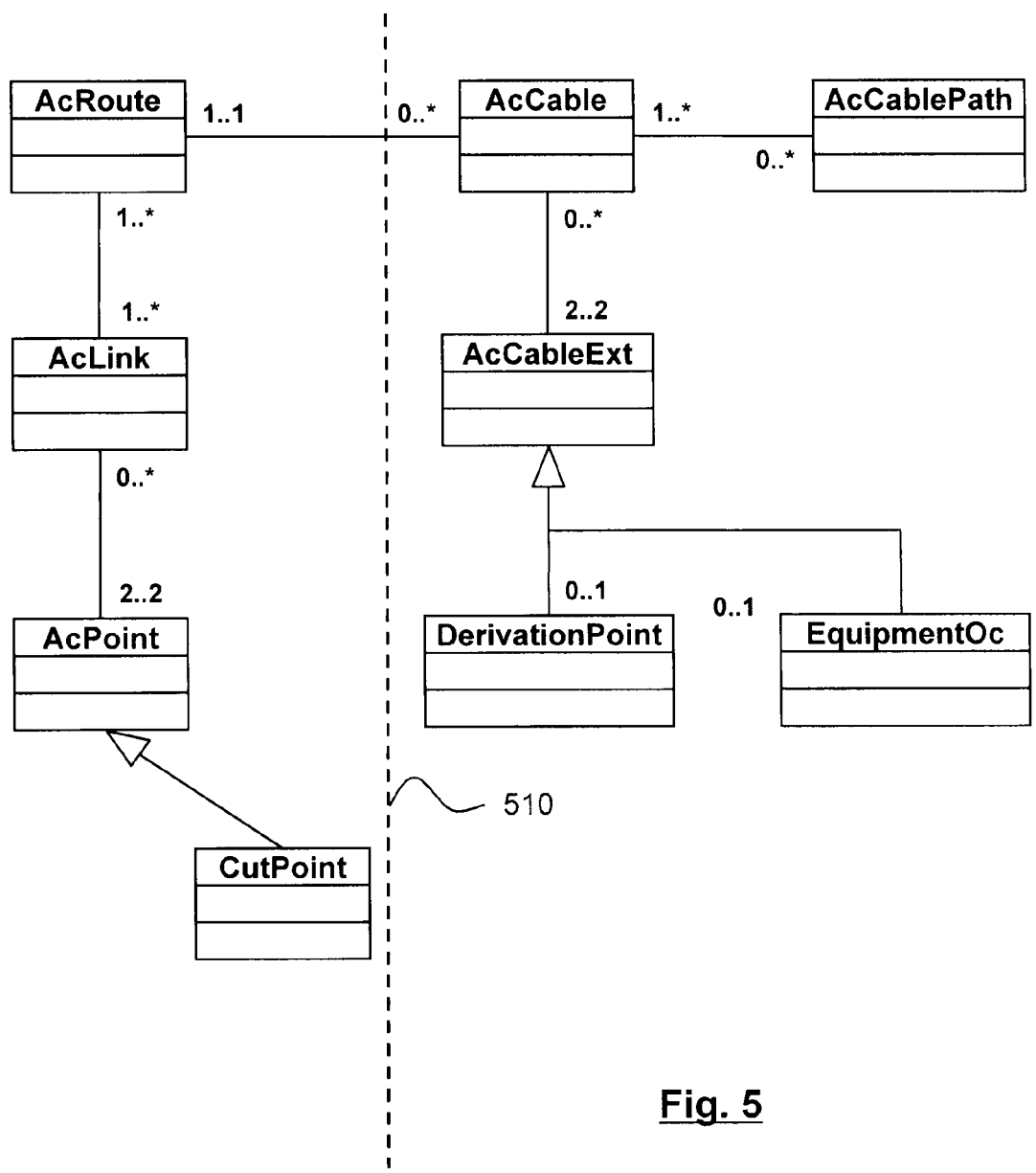
FIG. 5 gives an object-oriented schematic representation of the installation of an avionics platform in an aircraft.

FIG. 5 shows a UML representation of a data model describing the installation of the avionics platform in the aircraft.

Said model contains, on the one hand, the objects relating to the routing paths; "AcRoute", "AcLink", "AcPoint" and "CutPoint" and, on the other hand, objects related to the cabling of the avionics platform: "AcCable", "AcCableExt", "AcCablePath" and "DerivationPoint".

The "AcRoute" object represents a non-directional routing graph, where the term graph is to be understood within the meaning of graph theory. Said routing graph may be a tree i.e., a non-directional, acyclic and connected graph. In general, the routing graph may be defined as a connected set of geometric segments (the edges of the graph), represented by "AcLink", where each geometric segment is of course defined by its two extremities (the nodes of the graph). Each extremity is a geometric point inside the aircraft represented by "AcPoint" and possesses as its attributes its Cartesian coordinates along the X, Y, and Z axes relative to the reference point mentioned supra in reference to FIG. 2. Among certain segment extremities, cut points are represented by the "CutPoint" object. Any point at the intersection of a routing tree and of a section delimiting two consecutive sections of the aircraft is referred to as a cut point of said tree. For example, if the aircraft fuselage is composed of several sections assembled end to end, the cut points will be located on the planes of abutment of the sections. A person skilled in the art will understand that a routing graph represents in practice a set of cable paths in the aircraft.

The "AcCable" object represents a cable intended to be routed inside the aircraft. Each cable corresponds to an "AcRoute" routing tree. Reciprocally a routing tree may enable routing one or more cables. A cable may be part of a cable path, represented by "AcCablePath". All the cables interconnected with one another are referred to as a cable path. Moreover, each cable is defined by its two extremities represented by "AcCableExt". Each cable extremity possesses as an attribute its Cartesian coordinates along the X, Y, and Z axes relevant to the above-mentioned reference point. Finally, each cable extremity is connected either to an equipment occurrence "EquipmentOc" or to a derivation unit "DerivationPoint". A derivation unit makes it possible to connect a plurality of cables to the extremity of a given cable. The "EquipmentOc" object is represented symbolically here to indicate that the "AcCableExt" object inherits the attributes AC-X, AC-Y, AC-Z of the "EquipmentOc" object, in order words the coordinates of the extremities of a cable are obtained as the extremities of the equipment occurrences connected by said cable.

The model illustrated in FIG. 5 models the installation of the avionics platform inside the aircraft.

It permits the storage, on the one hand, of the avionics platform cabling (the part of the model to the right of line 510) in a database, called the cabling database and, on the other hand, the routing inside the aircraft (the part of the model to the left of line 510), in a database, called the routing database.

Figure 6:
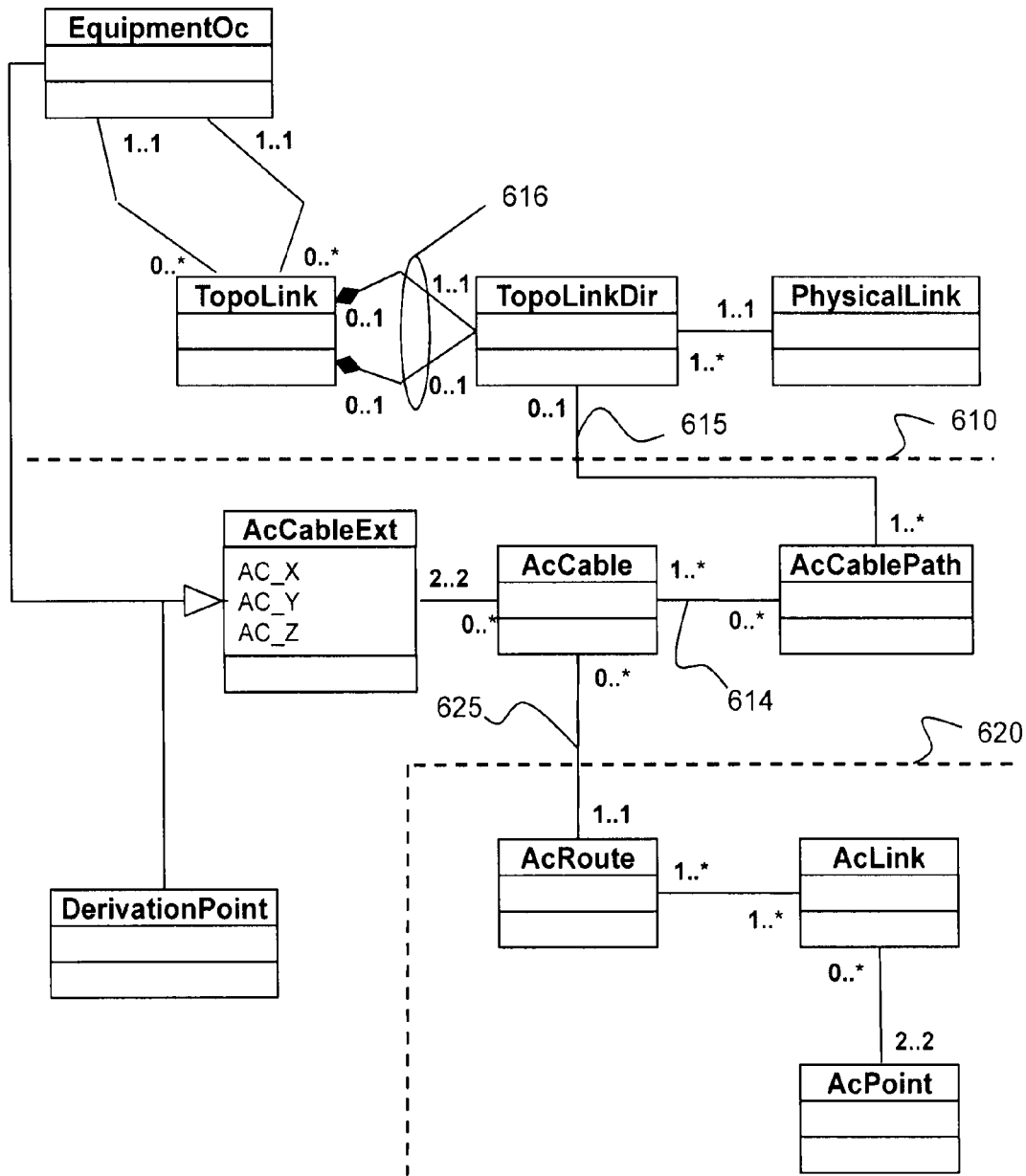
FIG. 6 represents the association between the representation of the avionics platform and that of its installation in the aircraft.

FIG. 6 represents the correspondence between the data structure representing the avionics platform and the data structure representing its installation in the aircraft.

Line 610 delimits the hardware representation of avionics platform from the representation of its installation in the aircraft. In particular, the relation 615 means that each branch of a physical link is made to correspond to a cable path. It is understandable that whenever a topological link and thus a physical link branch associated with said link changes or whenever a position of a equipment occurrence is modified, the cabling must be modified.

Similarly, line 620 delimits the representation of the cabling from the representation of its routing in the aircraft. In particular, relation 625 represents the routing of a cable along a routing path. Whenever the attributes of a cable are modified, the routing path must also be modified.

Figure 7:
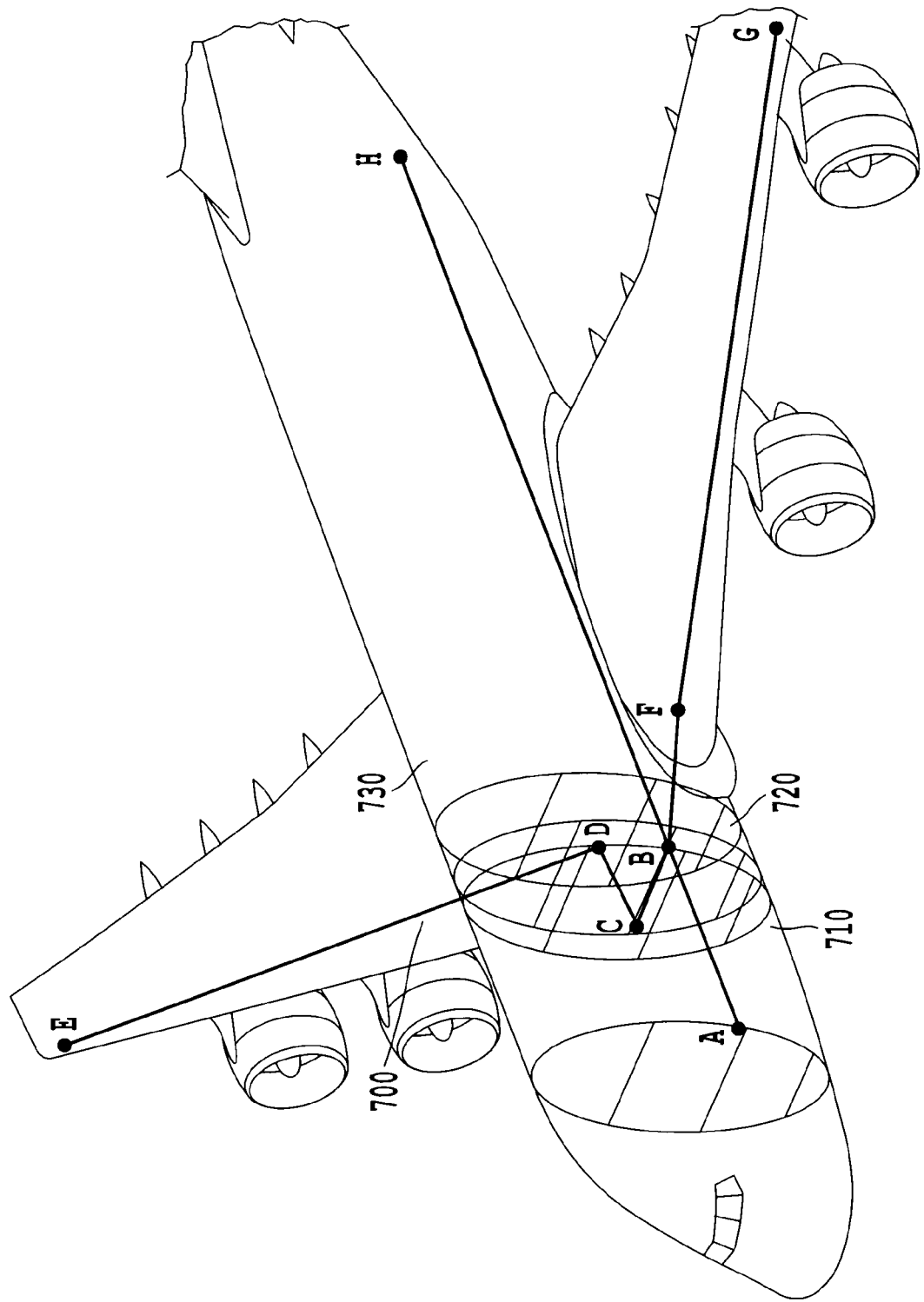
FIG. 7 gives an example of a routing graph and of routing paths in an aircraft.

FIG. 7 gives an example of a routing graph, in this particular case a routing tree, in an aircraft.

Said routing tree 700 enables connecting the avionic rack with the wings and aft part of the aircraft. It contains a set of segments AB, BC, CD, OF, BF, FG, BH.

Each path (within the meaning of graph theory) of the routing tree defines a routing path. Thus, the sets $RP_1=\{AB, BC, CD, DE\}$ or $RP_2=\{AB, BH\}$ or $RP_3=\{AB,BF,FG\}$ are routing paths of the graph 700.

Certain segment extremities, i.e., certain nodes of the graph are cut points as defined above, for example points C and D. The point C is at the intersection of the routing path $RP_1$ with the plane $\pi_1$ separating the sections 710 and 720; the point D is at the intersection of the routing path $RP_2$ with the plane $\pi_2$ separating the sections 720 and 730.

FIG. 8 gives an example of cable paths in an aircraft.

The routing tree is supposed to be the same as the routing tree in FIG. 7. Three equipment units $Eq_1, Eq_2, Eq_3$ connected by three cables $c_1, c_2, c_3$ are represented. The cables $c_2, c_3$ are connected to the cable $c_1$ via the derivation unit $T_d$. Thus, the cable path $CP_1$ formed by the concatenation of the cables $c_1$ and $c_2$ can be used to connect the equipment units $Eq_1$ and $Eq_2$. Similarly, the cable path $CP_2$ formed by the concatenation of the cables $c_1$ and $C_3$ enables connecting the equipment units $Eq_1$ and $Eq_3$.

FIGS. 9A and 9B illustrate different possibilities of routing for a physical link between a plurality of equipment occurrences of an avionics platform.

We consider here a physical link connecting an equipment occurrence $Eq_1$ to three other equipment occurrences designated as $Eq_2, Eq_3, Eq_4$. Said physical link is associated with three directional topological links $TL_1, TL_2$ and $TL_3$ all of which go from $Eq_1$ towards $Eq_2, Eq_3, Eq_4$, respectively. Each of said directional topological links corresponds to a physical link branch, which consequent results in three branches $b_1, b_2$ and $b_3$ connecting $Eq_1$ to $Eq_2, Eq_3, Eq_4$, respectively.

The routing of the physical link consists in allocating to each branch of said link a routing path across the routing graph 900. A through N, the nodes of the segments comprising said routing graph, $P_1$ through $P_4$ the points at which equipment units $Eq_1$ through $Eq_4$ are respectively located, and finally $H_1$ through $H_4$, the respective orthogonal projections of the $P_1$ through $P_4$ on the routing graph are noted. An orthogonal projection of a point on the routing graph means the point of the graph that is closest to the point in question.

FIG. 9A shows a first routing solution. The branch $b_1$ is routed via the routing path $RP_1$ defined by $RP_1=\{P_1H_1, H_1J, JI, IB, BE, EH_2, H_2P_2\}$, the branch $b_2$ is routed via the routing path $RP_2=\{P_1H_1, H_1J, JI, IB, BC, CF, FH_3, H_3P_3\}$, and the branch $b_3$ via the routing path $RP_3=\{P_1H_1,H_1A,AG,GH,HD, DH_4,H_4P_4\}$. Two derivation units $T_d^1$ and $T_d^2$ are necessary here and they are placed at points $H_1$ and B of the graph, respectively.

FIG. 9B shows a second routing solution. The branch $b_1$ is routed via the routing path $RP'_1$ defined by $RP'_1=\{P_1H_1, H_1A, AB, BE, EH_2, H_2P_2\}$, the branch $b_2$ is routed via the routing path $RP'_2=\{P_1H_1,H_1A,AB,BE,EF,FH_3,H_3P_3\}$, the branch $b_3$ via the routing path $RP'_3=\{P_1H_1,H_1A,AB,BC,CD,DH_4,$ $H_4P_4$}. Two derivation units $T_d^1$ and $T_d^2$ are still necessary and this are placed at points B and E.

It will be understood that the routing solution of FIG. 9A is not as good as the routing solution of FIG. 9B in terms of cabling length. For a given cabling length, the best routing solution will be the solution that requires the smallest number of derivation units, and given a certain number of [derivation] units, the best solution will be the solution that has the smallest number of cut points. It should be remembered that a cut point of a routing path is at the intersection of two adjacent sections of the aircraft. Such sections are manufactured and wired separately, which makes it necessary to provide a connector at each cut point when a cable path passes through the point in question.

FIG. 10 represents a flowchart of the routing method according to one embodiment of the invention.

This figure shows the general case of a physical link PL composed of a plurality N of branches, namely $b_1, \ldots, b_N$, where each such branch corresponds to a directional topological link, connecting two equipment occurrences $Eq_i$ and $Eq_j$. The position of the equipment occurrence $Eq_1$, i=1, ..., neq is noted in the series $P_1$, where neq is the number of equipment occurrences in question.

The initial assumption is that the routing graph RG associated with the physical link PL is known.

In a first step 1010, each of the points $P_1$ is projected on to the routing graph RG. This results in a set of points $H_i$ belonging to the edges of the graph. The routing graph RG is extended by adding the segments $H_iP_i$, i=1, ..., neq. Namely, $$RG^+ = RG \bigcup_{i=1}^{neq} H_i P_i$$

the graph extended in the manner described above.

In step 1020, for each branch $b_n$, the shortest path in the extended graph $RG^+$ making it possible to connect points $P_i$ and $P_j$ is determined. The that purpose, it is possible to use the Dijkstra algorithm, which itself is known, while allocating to each edge of the graph the length of the corresponding segment. Each branch $b_n$ is consequently associated with an ordered list of segments, where the first segment is necessarily $P_iH_i$ and the last segment $P_iH_j$.

In step 1030, the redundant segments between the resulting paths are eliminated. More precisely, if several copies of a segment are present, only a single representative of said segment is retained from the various paths. This results in a related set of pruned paths, where each pruned path is composed of an ordered set of segments.

In step 1040, out of the segments of the various pruned paths, those segments that share one extremity are identified. A point forming one extremity of at least two segments belonging to different pruned paths is called a derivation point. Such points are the places where the derivation units will be installed. Alternatively, in an equivalent manner, the derivation points are obtained as the extremities common to at least three segments of the set of pruned paths.

In step 1050, the respective cable routings are performed.

To do so, each associated pruned path is taken into consideration and the path is travelled in the direction of the branch associated with said path.

The segments are concatenated starting from the first of the list until reach either a derivation point or the extremity of the branch, i.e., the point at which receiver equipment occurrence is located. A first cable is defined as the set of segments thus concatenated.

If the extremity of the branch is not reached, a new operation of concatenation of the segments is performed starting from the first segment of the pruned path not yet concatenated until once again reaching a derivation point or the extremity of the branch in question. A new cable is defined as all the segments concatenated by the new operation of concatenation.

One then proceeds, step by step, until exhausting all segments of the pruned path, i.e., until reaching the extremity of the branch in question.

Thus, for each pruned path, a set of cables is defined, with one extremity of a cable being connected either to an equipment occurrence or to a derivation unit. It is possible to identify cable by a reference and to associate said reference with a sub-list of segments of the routing path from which it originated. Said association is represented in FIG. 6 by the relation 625. Each cable thus defined is then installed in the aircraft according to the routing path thus determined.

If we now once again consider a branch of the physical link and we replace, in the ordered list of segments comprising the path corresponding to said branch, each sub-list of segments related to a cable with the reference of the cable in question, a list of cable references is obtained. Thus, each branch is associated with a list of cables connected end to end, in other words a cable path connecting the sender equipment occurrence to the receiver equipment occurrence of the branch. Said association is represented in FIG. 6 by the relation 615.

With each of the cables routed in the aircraft, it is understandable that the physical link branch is also routed.

Thus, it is possible to route all the branches of a physical link and thus the physical link itself, based on a given routing graph and equipment occurrence positions.

The routing method according to the invention may also be used to determine the optimal positions of the equipment occurrences that make it possible to minimize, for a given routing graph, the cabling distances. To that purpose, the routing operation of is repeated for different positions of the equipment occurrences. The cabling solutions and/or the cabling distances are then compared.

Alternatively, the routing method may be used to test several possible routing graphs, for given equipment occurrence positions. The routing solutions and/or cabling distances are compared for the various graphs.

Finally, the routing method can make it possible to evaluate the existing installation of an avionics platform by calculating, for example, the difference between the actual cabling distance and the optimal cabling distance.

In practice, the routing method according to the invention is implemented by a computer program. Each routing graph is defined by its extremities (or nodes) and by its edges. Each extremity of the graph is defined by its spatial coordinates and each edge by the pair of extremities that it connects.

Similarly each physical link is defined by a set of branches, where each branch is defined by the pair of equipment units (more precisely, the pair of equipment occurrences) that it connects. Recall that each equipment occurrence has, among other attributes, the spatial coordinates of its location. Recall that the routing graphs are stored in the routing database, notated as DBR and that the physical links are stored in the hardware database, notated as DBL.

Based on those two databases, the routing program builds a cabling database providing a cable path for each physical link branch and a routing database providing a routing path for each cable of the cable path as indicated above.

An illustration of routing method according to the invention is given below based on the example of FIG. 9B.

The physical link PL to be routed is composed of a branch $b_1$ connecting $P_1$ to $P_2$, of a branch $b_2$ connecting $P_1$ through $P_3$ and of a branch $b_3$ connecting $P_1$ through $P_4$.

The points $P_1$ through $P_3$ are projected onto the routing graph in question, yielding the points $H_1$ through $H_3$. The routing graph is extended by adding the segments $P_1H_1$, $P_2H_2$ and $P_3H_3$.

The shortest paths are determined for each branch, for example by means of the Dijkstra algorithm, i.e., for $b_1$: $P_1H_1$, $H_1A$, AB, BE, $EH_2$, $H_2P_2$
for $b_2$: $P_1H_1$, $H_1A$, AB, BE, EF, $FH_3$, $H_3P_3$
for $b_3$: $P_1H_1$, $H_1A$, AB, BC, CD, $DH_4$, $H_4P_4$ Then the redundant segments among the various routing paths are eliminated, resulting in the pruned paths:

for $b_1$: $P_1H_1$, $H_1A$, AB, BE, $EH_2$, $H_2P_2$
for $b_2$: EF, $FH_3$, $H_3P_3$
for $b_3$: BC, CD, $DH_4$, $H_4P_4$ The extremities common to at least two segments belonging to distinct pruned paths are determined. The resulting derivation points are:

the extremity E common to the segments BE and EF;
the extremity B common to the segments AB and BC.

Alternatively, it is possible to determine the derivation points as those belonging to at least three segments, without taking the distinct pruned paths into consideration. In fact:

the extremity E common to the segments BE, EF, $EH_2$;
the extremity B common to the segments AB, BC, BE;

Then the segment concatenation process is performed for the (not pruned) path associated with $b_1$. Thus, three cables are determined:

$c_1$: $P_1H_1$, $H_1A$, AB
$c_2$: BE
$c_3$: $EH_2$, $H_2P_2$

The concatenation process then yields, for $b_2$, the cable $c_4$: EF, $FH_3$, $H_3P_3$ and finally, for $b_3$, the cable $c_5$: BC, CD, $DH_4$, $H_4P_4$ It then suffices to replace in the routing paths the segments sub-lists with the cable references in order to obtain the cable paths:

pour $b_1$: $c_1$, $c_2$, $c_3$
pour $b_2$: $c_1$, $c_2$, $c_4$
pour $b_3$: $c_1$, $c_5$.

Once the routing has been performed, it is possible to determine the robustness of the avionics platform in the case of an accident, for example an engine explosion, a wheel explosion, or the impact of a bird.

For each type of accident, it is possible to use simulation and/or experience as a basis for determining the physical elements of the aircraft that might be damaged according to their positions in the aircraft. For example, it is possible to determine which cables or which equipment occurrences are likely to be damaged in a given accident. It is then important to know the avionic functions that are affected by the accident in question.

According to one particular embodiment of the invention, the modeling of the implementation of the avionics platform in the aircraft, as illustrated in FIG. 6, can be used advantageously to deduce from the physical elements impacted by the accident the avionic functions that are affected.

Digital simulation, using a three-dimensional model of the aircraft, can determine the list of points of the routing graph (s) impacted by the accident. More precisely, for each routing graph segment, the list of points, called break points, impacted by the accident in question are determined. It is then possible to deduce, thanks to the data model of FIG. 6, the impacted cable set CAB_L, where a cable is considered to be impacted if it passes by an "AcLink" segment containing a break point. In addition, a set EQ_L of equipment occurrences impacted by the accident is determined.

According to the data model of FIG. 6 (see 614 in FIG. 6), it is possible to determine, for each cable of CAB_L, the cable paths that include said cable and are consequently affected themselves. Namely, CAB_PATH_L the set of cable paths affected by the loss of the cables of CAB_L.

It is then possible to deduce (see 615 and 616 in FIG. 6) the list of topological links that are affected by the loss of the cable paths of CAB_PATH_L. Namely TL_L the list of such topological links.

One then deduces (via the relations 419 in FIG. 4) from the loss of the topological links of TL_L the set PATH_L of the topological paths (represented by "Path") affected by the accident.

Finally, one constructs the set FOL_L of function link occurrences (modeled by "FctLinkOc") that are affected either:

by the loss of a corresponding topological path (via the relation of 420 en FIG. 4) of TL_L; or
by the loss of a software module (via the relation 401) hosted by an equipment occurrence belonging to EQ_L (via the relation 410).

The set FO_L of software modules (modeled by "SystemFunctionOc") hosted by the equipment occurrences belonging to EQ_L, as well as the set FOL_L of the function link occurrences affected enable a complete description of the impact of the accident in terms of avionic functions.

If the desired functional robustness cannot be obtained from the chosen routing and/or the chosen placement for the equipment occurrences, a new attempt at routing and/or of placement of the equipment occurrences in the aircraft is made.

The invention claimed is:

1. A method of computerized routing of a physical link of an avionics platform inside an aircraft, where said physical link connects a plurality of physical equipment units and is composed of one or more branches, where each branch of said link connects a sender equipment unit to a receiver equipment unit of said plurality, said method comprising:

projecting the positions of the sender and receiver equipment units orthogonally onto at least one predetermined routing graph inside the aircraft and extending said graph at the points defined by said positions and by their respective projections on the graph and by the links between the sender and receiver equipment units;

determining, for each branch of said link, a routing path being the shortest path through the graph thus extended between the sender and receiver equipment units that it connects, where said routing path is defined by an ordered list of segments between said equipment units;

eliminating redundant segments between the routing paths to obtain pruned paths, where a redundant segment is defined as belonging to at least two routing paths;

determining derivation points as the segment extremities common to at least three segments of said pruned paths;

defining, based on each pruned path, a set of cables whose extremities are located either at an equipment unit point or at a derivation point, with said cables being routed along the routing path.

2. The routing method according to claim 1, wherein the cables are defined by concatenating, for each pruned path, the segments comprising said path, with the operation of concatenation progressing in the direction of the branch and being interrupted whenever it reaches a derivation point or receiver equipment unit, with a cable being defined by the concatenated segments between two successive interruptions.

3. The routing method according to any of the preceding claims, wherein, for each branch, the shortest path in the routing graph between the sender equipment unit and the receiver equipment unit is obtained using a Dijkstra algorithm.

4. The routing method according to claim 1, further comprising:
   storing, in a first database, a representation of at least said routing graph, where said routing graph is defined by its nodes and by the edges connecting said nodes;
   storing, in a second database, a representation of the physical links of the avionics platform and, for each physical link, the various branches within said physical link.

5. The routing method according to claim 4, further comprising:
   storing, in a third database, a representation of the cables connecting the equipment units;
   storing, in a fourth database, the routing path associated with each cable.

6. The routing method according to claim 5, comprising storing a representation of said derivation points.

7. The routing method according to claim 5, wherein the first database also contains a representation of cut points, where a cut point is defined as the intersection of a routing path with the abutment of two consecutive sections forming the aircraft.

8. The routing method according to claim 1, wherein the routing method is performed for all the physical links of the avionics platform and comprising calculating a total cabling length as the sum of the lengths of the cables obtained for all the physical links, where the length of a cable is determined as the sum of the lengths of the segments that form it.

9. The routing method according to claim 8, wherein the routing method is repeated for various positions of the equipment units, and then a set of positions of said equipment units that leads to the shortest total length of cabling is selected.

10. The routing method according to claim 8, wherein said routing method is repeated for different routing graphs and comprising selecting the routing graph that leads to the shortest total cabling length.

11. The routing method according to claim 7, wherein said routing method is repeated for different positions of the equipment units and/or different routing graphs and comprises selecting a set of positions of said equipment units and/or the routing graph that leads to the lowest number of cut points.

12. The routing method according to claim 1, comprising simulating an accident of the aircraft and determining a first list of cables (CAB_L) impacted by said accident, from points of the routing graph that are themselves impacted, and/or a second list of equipment units (EQ_L) impacted by said accident and then:
   deducing a first set (FO_L) of software modules hosted by said equipment units of the second list;
   deducing a second set (FLO_L) of function links between software modules, where said function links are affected either because of a software module to which they are connected, belonging to the first set, or because of a cable of the first list supporting a topological link used by said function links.

* * * * *